(12) United States Patent
Botez et al.

(10) Patent No.: US 6,195,381 B1
(45) Date of Patent: Feb. 27, 2001

(54) NARROW SPECTRAL WIDTH HIGH-POWER DISTRIBUTED FEEDBACK SEMICONDUCTOR LASERS

(75) Inventors: Dan Botez; Thomas L. Earles, both of Madison; Luke J. Mawst, Sun Prairie, all of WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/067,189

(22) Filed: Apr. 27, 1998

(51) Int. Cl.$^7$ .................................. H01S 5/00; H01S 3/08

(52) U.S. Cl. ................................................ 372/96; 375/46

(58) Field of Search ........................................ 372/96, 46

(56) References Cited

U.S. PATENT DOCUMENTS

| | | | |
|---|---|---|---|
| 4,745,615 | * 5/1988 | Kaneiwa et al. | 372/96 |
| 4,852,116 | 7/1989 | Takiguchi et al. | |
| 4,860,298 | 8/1989 | Botez et al. | |
| 5,363,399 | 11/1994 | Yagi | |
| 5,727,013 | 3/1998 | Botez et al. | |
| 5,818,860 | * 10/1998 | Garbuzov et al. | 372/45 |

FOREIGN PATENT DOCUMENTS

| | | |
|---|---|---|
| 0579437 | 1/1994 | (EP) . |
| 62-057259 | 3/1987 | (JP) . |

OTHER PUBLICATIONS

Sagawa et al, Satble Single–Longitudinal Mode Operation of .98um InGaAs/InGaAsP/GaAs Strained Quantum Well Distributed Feedback Lasers, Electronics Letters, Dec. 1992, vol. 28, No. 25, pp. 2336–2337.*
York et al, MOCVD regrowth over GaAs/AlGaAs gratings for high power long–lived InGaAs/AlGaAs lasers, Journal of Crystal Growth 124 (1992), pp. 709–715.*

L. J. Mawst, et al., "High Continuous Wave Output Power INGAAS/INGAASP–INGAP Diode Lasers: Effect of Substrate Misorientation." Applied Physics Letters, vol. 67, No. 20, Nov. 13, 1995, pp. 2901–2903.

J. K. Wade, et al., "5W Continuous Wave Power, 0.181 $\mu$m Emitting, Al–Free Active–Region Diode Lasers," Applied Physics Letters, vol. 71, No. 2, Jul. 14, 1997, pp. 172–174.

S. B. Ross, et al., "A Single Mode, CW, Diode Laser at the Cesium D1 (894.59 nm) transition," Optics Communications, vol. 120, No. 3, Oct. 15, 1995, pp. 155–157.

M. Sagawa, "Stable Single–Longitudinal Mode Operation of 0.98 $\mu$m INGAAS/INGAASP/GAAS Strained Quantum Well Distributed Feedback Lasers," Electronics Letters, vol. 28, No. 25, Dec. 3, 1992, pp. 2336–2337.

T. Earles, et al., "1.1W Continuous Wave Narrow Spectral Width Emission From Broad Stripe DFB Diode Lasers," Applied Physics Letters, vol. 73, No. 15, Oct. 12, 1998, pp. 2073–2074.

(List continued on next page.)

*Primary Examiner*—Frank G. Font
*Assistant Examiner*—Armando Rodriguez
(74) *Attorney, Agent, or Firm*—Foley & Lardner

(57) ABSTRACT

High power edge emitting semiconductor lasers are formed to emit with very narrow spectral width at precisely selected wavelengths. An epitaxial structure is grown on a semiconductor substrate, e.g., GaAs, and includes an active region at which light emission occurs, upper and lower confinement layers and upper and lower cladding layers. A distributed feedback grating is formed in an aluminum free section of the upper confinement layer to act upon the light generated in the active region to produce lasing action and emission of light from an edge face of the semiconductor laser. Such devices are well suited to being formed to provide a wide stripe, e.g., in the range of 50 to 100 $\mu$m or more, and high power, in the 1 watt range, at wavelengths including visible wavelengths.

28 Claims, 7 Drawing Sheets

OTHER PUBLICATIONS

P.K. York, et al., "MOCVD Regrowth Over GaAs/AlGaAs Gratings for High Power Long–Lived InGaAs/AlGaAs Laser," Journal of Crystal Growth, vol. 124, 1992, pp. 709–715.

M. Sagawa, et al., "Stable Single–Longitudinal Mode Operation of 0.98 $\mu$m InGaAs/InGaAsP/GaAs Strained Quantum Well Distributed Feedback Lasers," Electronics Letters, vol. 28, No. 25, Dec. 3, 1992, pp. 2336–2337.

Y. K. Sin, et al., "High Power 0.98 $\mu$m InGaAs–GasAs–InGaP Distributed Feedback Buried Heterostructure Strained Quantum Well Lasers," Electronics Letters, vol. 29, No. 10, May 13, 1993, pp. 920–921.

J.S. Major, et al., "High Power Distributed Bragg Reflector Laser Diodes Operating Between 0.83 and 1.083 $\mu$m,", CLEO'94, 1994, pp. 4–5.

M.S. Albert, et al., "Biological Magnetic Resonance Imaging Using Laser–Polarized$^{129}$Xe," Nature, vol. 370, Jul. 21, 1994, pp. 129–201.

Iulian B. Petrescu–Prahova, et al., "Design of a 1W, Single Filament Laser Diode," IEICE Transactions on Electronics, vol. E77–C, No. 9,Sep. 1994, pp. 1472–1478.

H. P. Gauggel, et al. "Fabrication and Operation of First–Order GaInP/AlGaInP DFB Lasers at Room Temperature," Electronics Letters, 1995.

Sung Nee George Chu, et al., "Grating Overgrowth and Defect Structures in Distributed–Feedback–Buried Heterostructure Laser Diodes," IEEE Journal of Selected Topics in Quantum Electronics, vol. 3, No. 3, Jun. 1997, pp. 862–873.

M. P. Nesnidal, et al., "Distributed–Feedback Grating Used as an Array–Mode Selector in Resonant Antiguided Diode Laser Arrays: Effects of the Mirror Facet Position with Respect to the Grating," IEEE Photonics Technology Letters, vol. 10, No. 4, Apr. 1998, pp. 507–509.

* cited by examiner

NARROW SPECTRAL WIDTH HIGH-POWER DISTRIBUTED FEEDBACK SEMICONDUCTOR LASERS

This invention was made with United States government support awarded by the following agencies: DOD-AF, Grant No.: F49620-96-C-0052; NSF Grant No.: 9522035; NSF Grant No.: 9612244; NSF Grant No.: 9522667; and NSF Grant No.: 9531011. The United States has certain rights in this invention.

FIELD OF THE INVENTION

This invention pertains generally to the field of semiconductor diode lasers and particularly to edge emitting distributed feedback semiconductor lasers.

BACKGROUND OF THE INVENTION

Semiconductor diode lasers are formed of multiple layers of semiconductor materials. The typical semiconductor diode laser includes an n-type layer, a p-type layer and an undoped active layer between them such that when the diode is forward biased electrons and holes recombine in the active region layer with the resulting emission of light. The layers adjacent to the active layer typically have a lower index of refraction than the active layer and form cladding layers that confine the emitted light to the active layer and sometimes to adjacent layers. Semiconductor lasers may be constructed to be either edge emitting or surface emitting. In an edge emitting Fabry-Perot type semiconductor laser, crystal facet mirrors are located at opposite edges of the multi-layer structure to provide reflection of the emitted light back and forth in a longitudinal direction, generally in the plane of the layers, to provide lasing action and emission of laser light from one of the facets. Another type of device, which may be designed to be either edge emitting or surface emitting, utilizes distributed feedback structures rather then conventional facets or mirrors, providing feedback for lasing as a result of backward Bragg scattering from periodic variations of the refractive index or the gain or both of the semiconductor laser structure.

Semiconductor lasers having CW power in the watt-range and narrow bandwidth, e.g., less than 2 Å full width half maximum (FWHM), would be desirable for a variety of applications. Examples include 0.894 μm diode lasers which may be used for polarizing Cs to generate spin-polarized Xe gas for magnetic resonance imaging, low-chirp pump sources for solid state lasers, and in spectroscopy sources for monitoring environmental gases. Conventional broad stripe ($\geq 25$ μm) semiconductor lasers used for obtaining high powers typically have a spectral width of about 20 Å FWHM or more at high drive levels and broaden further under quasi-CW operation. Significant improvements in spectral width can be obtained using distributed feedback (DFB) gratings or distributed Bragg reflectors (DBR) rather than Fabry-Perot mirror facets for optical feedback. 278 mW CW power with about 1 Å of wavelength variation, resulting from mode hopping, has been reported for narrow-stripe DBR lasers. J. S. Major, et al., Electron. Lett. Vol. 29, No. 24, p. 2121, 1993. Using DFB phase-locked laser arrays, narrow bandwidth operation has been obtained from large apertures at relatively long wavelengths ($\lambda$=1.3 μm to 1.5 μm). 120 mW pulsed operation has been reported from a 45 μm aperture device ($\lambda$=1.3 μm), Y. Twu, et al., Electron. Lett. Vol. 24, No. 12, p. 1144, 1988, and 85 mW CW from a 72 μm aperture device (X=1.55 μm), K. Y. Liou, et al., Tech. Dig. 13th IEEE Int. Semicond. Laser Conf., Paper D7, 1992.

For applications where (lateral) spatial coherence is not necessary, a broad-stripe laser with a DFB grating is apparently well suited for achieving high CW powers with narrow spectral linewidth.

A limitation is encountered with DFB lasers designed to operate at shorter wavelengths including visible light wavelengths, in that conventional diode lasers grown on GaAs substrates, which can emit in the range of wavelengths between about 0.6 μm to 1.1 μm, generally have optical confinement layers containing aluminum as well as cladding layers containing aluminum. Due to the high reactivity of aluminum (i.e., essentially instant oxidation when exposed to air), it has proven to be very difficult to make single frequency lasers of the DFB type in the foregoing wavelength range in which the grating is buried within the multi-layer semiconductor structure. Consequently, the commercially available high power, narrow linewidth lasers have been of the distributed Bragg reflector (DBR) type, in which the grating is outside of the active lasing part of the structure. However, such DBR devices suffer from the major drawback of mode hopping that occurs with increasing drive current due to changes in the lasing-region index of refraction with increasing drive power.

SUMMARY OF THE INVENTION

The present invention encompasses a high power edge emitting semiconductor laser with very narrow spectral width that can be tailored to operate at precisely selected wavelengths including wavelengths in the visible range. In accordance with the invention, typical CW powers in the watt range are obtainable with a narrow linewidth of 2 Å FWHM or less. Consequently, such lasers are well suited to applications requiring precise narrow linewidth laser sources, such as for polarizing cesium or rubidium for use in magnetic resonance imaging with spin polarized xenon.

The edge emitting semiconductor laser of the invention includes a substrate and an epitaxial structure preferably grown on orientation on the substrate. The epitaxial structure includes a layer with an active region at which light emission occurs, upper and lower confinement layers adjacent the active region layer, upper and lower cladding layers adjacent the confinement layers, outer edge faces perpendicular to the active region layer, and electrodes by which voltage can be applied across the epitaxial structure and the substrate. A distributed feedback grating is formed on an aluminum free section of the upper confinement layer. The grating is comprised of periodically alternating elements differing from one another in dielectric constant, and thus generally in index of refraction, to provide optical feedback for a selected effective wavelength of light generation from the active region. Because the distributed feedback grating in accordance with the invention is formed in a layer above the active region, regrowth problems and the propagation of dislocations that are encountered with gratings formed below the active region layer are avoided. In addition, it has been found, in accordance with the invention, that by utilizing a confinement layer at least a section of which is aluminum free, the grating may be readily etched in the aluminum free confinement layer to provide a grating surface on which additional epitaxial layers may be grown without difficulty. Such devices are well-suited to being formed to provide a wide emitting aperture, preferably at least 25 μm to provide high power lasing, which may be defined by current confinement.

The invention may be incorporated in semiconductor lasers having a GaAs substrate and epitaxial layers (preferably grown on (100) orientation on the substrate) including an active region layer with single or multiple quantum wells of InGaAs surrounded by InGaAsP barrier layers, optical confinement layers of InGaP, with the distributed feedback grating formed in the top surface of the upper InGaP confinement layer, and cladding layers of InGaAlP or AlGaAs. The thickness of the upper confinement layer and the spacing of the grating from the active region layer is preferably at least about 0.2 $\mu$m to ensure small coupling to the grating. Small grating coupling coefficient, K, is needed to maintain a κL product of about unity, where L is the cavity length between the edge faces of the laser, which, in turn, ensures both efficient DFB laser operation as well as single-longitudinal-mode operation to high drive levels above threshold. Since watt-range lasers require long cavities (L≧1 mm), to keep κL~1 it is of critical importance to have a low κ value. Such structures can be formed to operate in the range of 1 watt CW with a linewidth of less than 1 Å and at 1 watt pulsed (5 $\mu$s-wide pulses) with a linewidth of 1.2 Å. Because the upper confinement layer of InGaP is aluminum free, it may be etched in a conventional manner to leave a surface of the grating on which regrowth is readily accomplished.

Further objects, features and advantages of the invention will be apparent from the following detailed description when taken in conjunction with the accompanying drawings.

DETAILED DESCRIPTION OF THE INVENTION

Figure 1:
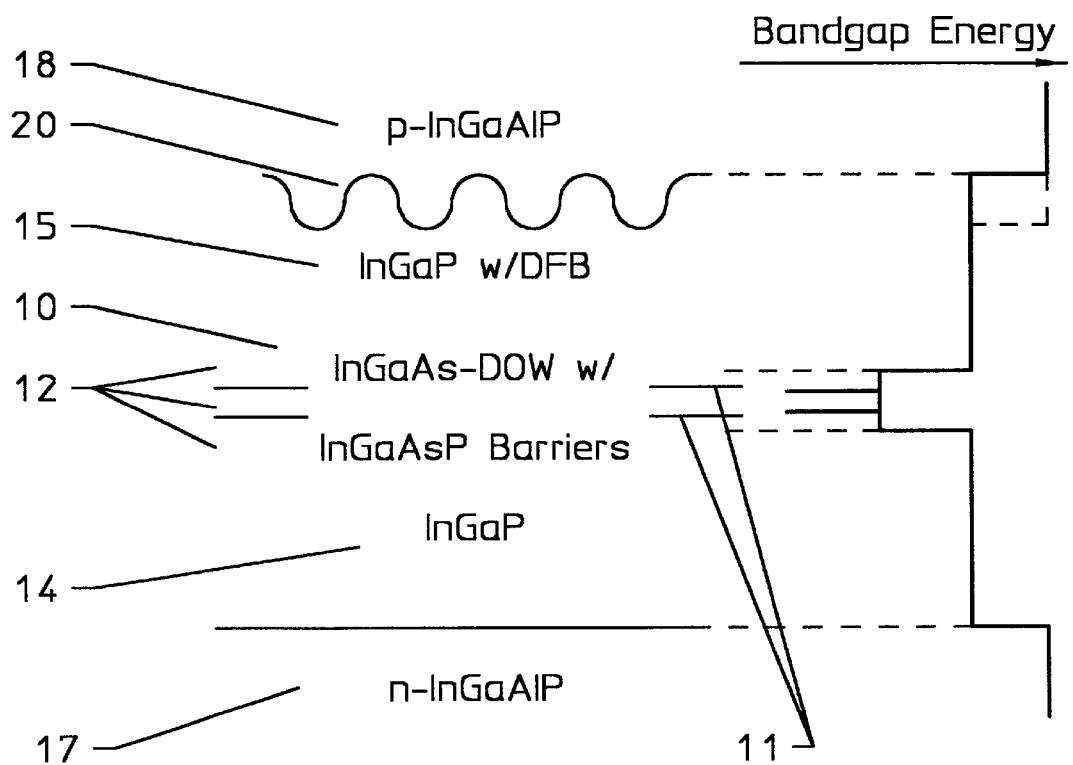
FIG. 1 is a schematic diagram illustrating an example of a composition for the active region layer and adjacent confinement and cladding layers in accordance with the invention.

For purposes of illustrating the present invention, a diagram illustrating an exemplary multi-layer waveguide structure in accordance with the invention is shown in FIG. 1 along with a diagram of the band gap energy for the several layers. The exemplary structure of FIG. 1 includes an active region layer 10 including double quantum wells 11 of InGaAs surrounded by InGaAsP barrier layers 12, a lower confinement layer 14 and an upper confinement layer 15, both formed of InGaP, and a lower cladding layer 17 of n-type InGaAlP and an upper cladding layer 18 of p-type InGaAlP adjacent to the lower and upper confinement layers, respectively. A distributed feedback grating 20 is formed at the top of the upper confinement layer 15. The upper confinement layer is formed of InGaP and is free of aluminum. Thus, once the grating 20 has been formed in the upper confinement layer 15, the upper cladding layer 18 and subsequent layers may be readily grown over the grating. The right-hand side of FIG. 1 is a diagram illustrating the band gap energy levels of these various layers.

Figure 2:
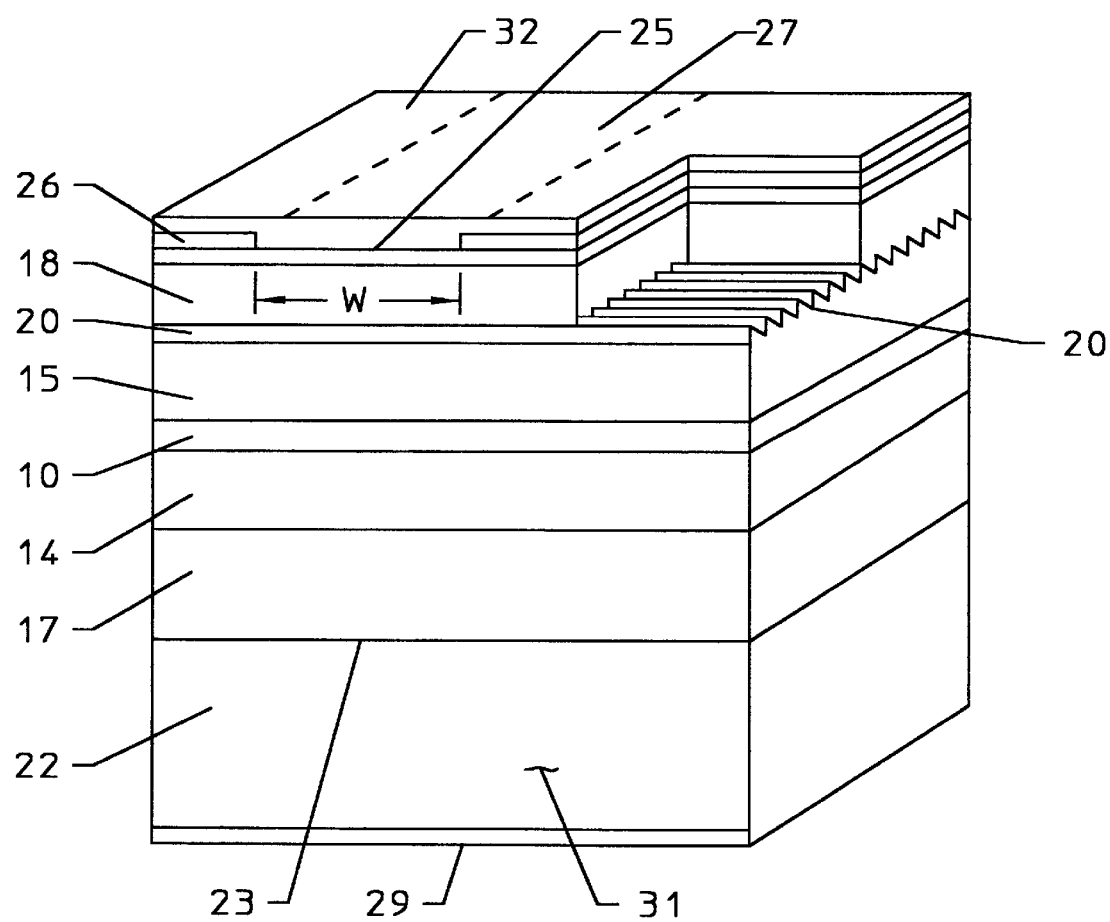
FIG. 2 is a perspective view of an exemplary semiconductor laser formed in accordance with the invention.

A simplified perspective view of a semiconductor laser incorporating the waveguide layers of FIG. 1 is shown in FIG. 2. The layers illustrated in FIG. 2 are epitaxially grown on a GaAs substrate 22. It is preferred that the top surface 23 of the substrate 22 be the (100) surface and that the epitaxial layers be grown on this surface exactly on orientation. For exemplification only, current confinement may be provided to define the emitting aperture by insulating layers 26 of $SiO_2$ over a cap layer 25 of p+ GaAs, with a top metal electrode 27 in contact with the cap layer 25 at the top face of the laser between the insulating $SiO_2$ layers to provide electrical conduction thereto. A bottom metal electrode 29 is formed on the bottom face of the substrate 22 so that voltage may be applied across the semiconductor laser between the electrodes 27 and 29. The width W of the metal electrode 27 in contact with the cap layer 25 defines the effective stripe width of the semiconductor diode in the active layer 10 at which light emission will occur.

A specific example of such a structure is a 100 $\mu$m wide stripe laser which operates at 1.1 W CW with a linewidth of 0.9 Å, and at 1 W quasi-CW (5 $\mu$s pulse width at 2 kHz repetition rate) with a linewidth of 1.2 Å. The double quantum well layers 11 are formed of $In_{0.3}Ga_{0.97}As$ between and separated by InGaAsP (bandgap energy=1.62 eV) barrier layers 12, with the optical confinement layers 14 and 15 formed of $In_{0.47}Ga_{0.53}P$, and with the cladding layers 17 and 18 formed of $In_{0.5}(Ga_{0.5}Al_{0.5})_{0.5}P$. The large bandgap of the $In_{0.5}(Ga_{0.5}Al_{0.5})_{0.5}P$ cladding layers 17 and 18 ensures good carrier confinement for these structures, resulting in higher internal efficiencies than would be obtained from an entirely aluminum free structure. The grating 20 is a second-order grating that is holographically patterned and wet etched directly into the InGaP upper confinement layer 15 over the active region. As an example, the grating, which may have a sinusoidal form, can have a period between adjacent peaks of the periodic elements of about 2740 Å and a peak-to-peak depth of about 500 Å. Because InGaP is less prone to oxidation than aluminum containing compounds, regrowth over the grating is readily accomplished. Thus, the InGaAlP upper cladding layer 18 is simply grown over the grating 20, followed by the p+ GaAs cap layer 25. This structure can be designed, for example, to lase at 0.894 $\mu$m. Multiple oxide stripe broad area laser structures may be processed from this material by cleaving the bars perpendicularly to the stripe along the crystal facets to provide an emitting edge face 31 and an opposite reflecting edge face 32 to produce 1 mm-long lasers with, e.g., 5% reflectivity at the emitting edge face 31 and 95% facet reflectivity at the reflecting edge face 32.

Figure 3:
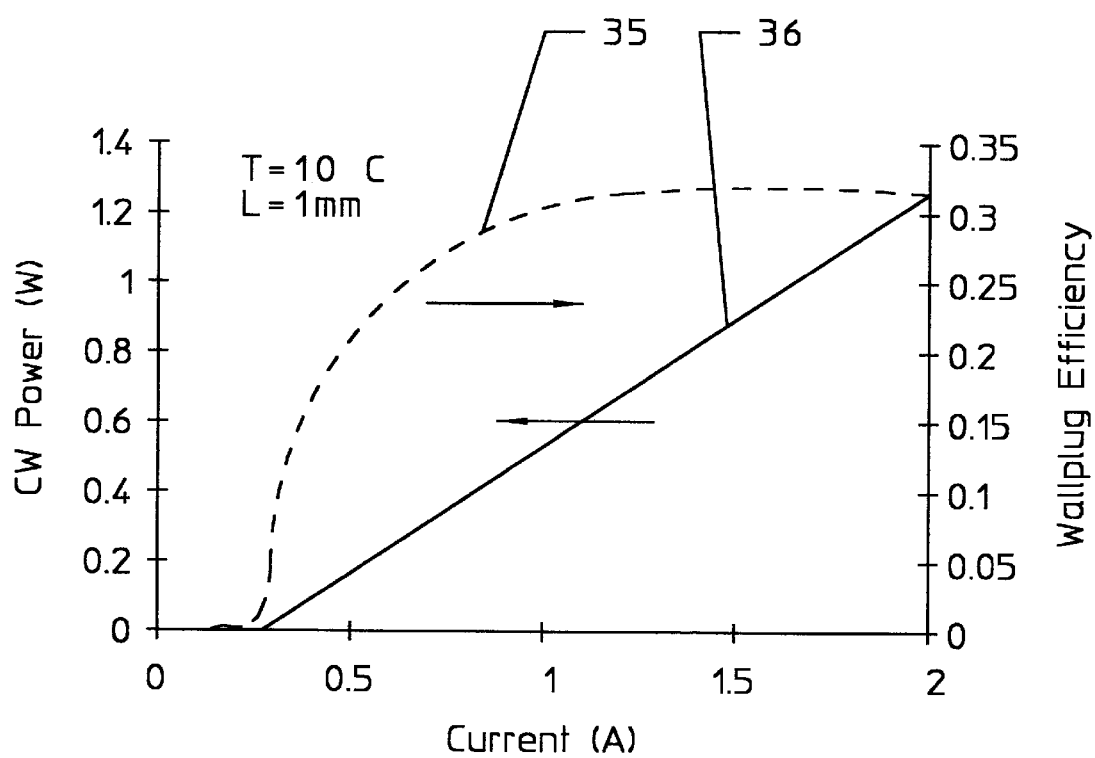
FIG. 3 are plots of CW power and wallplug efficiency as a function of drive current for the exempla device of FIG. 2.

The CW power-current curve 35 for a 1 mm-long, 100 $\mu$m-wide laser in accordance with the invention at 10° C. as shown in FIG. 3, and illustrates that the threshold current density, $J_{th}$, is 240 A/cm$^2$, the differential quantum efficiency, $\eta_d$, is 51%, and the wallplug efficiency curve 36 shown in FIG. 3 illustrates that the wallplug efficiency $\eta_p$ reaches a maximum value of 32% at 1.1 W (7.3 times threshold). By comparison, devices made without the distributed feedback grating 20 but with otherwise the same structure and dimensions have, at 20° C., a $J_{th}$ of 225 A/cm$^2$ and $\eta_d$ of 62% with characteristic temperatures $T_0$=200K and $T_1$=480K.

Figure 4:
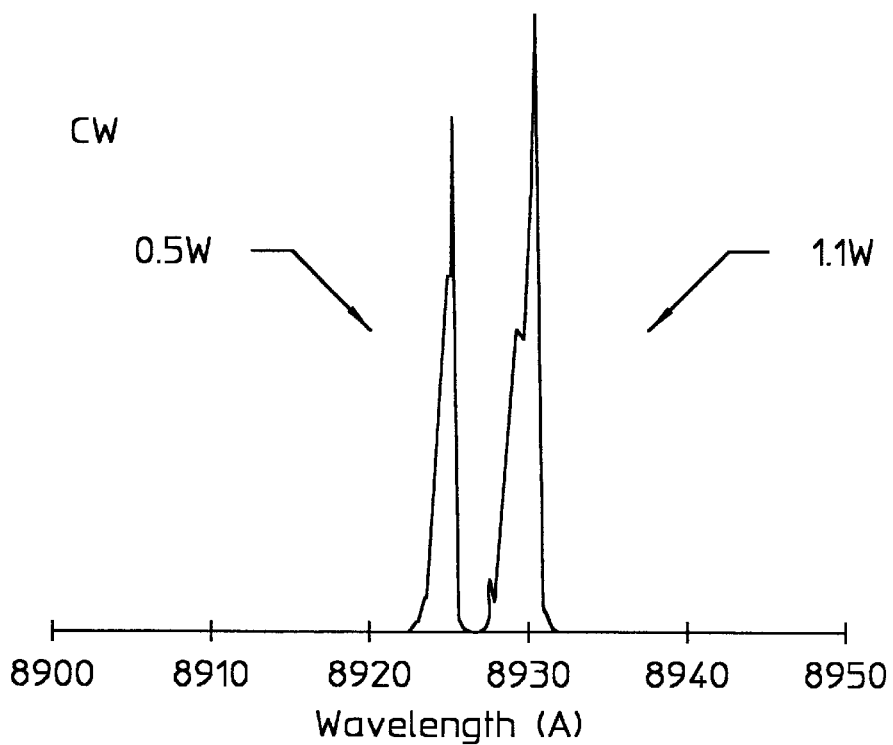
FIG. 4 is a plot of CW emission wavelengths for the exemplary device of FIG. 2.
Figure 5:
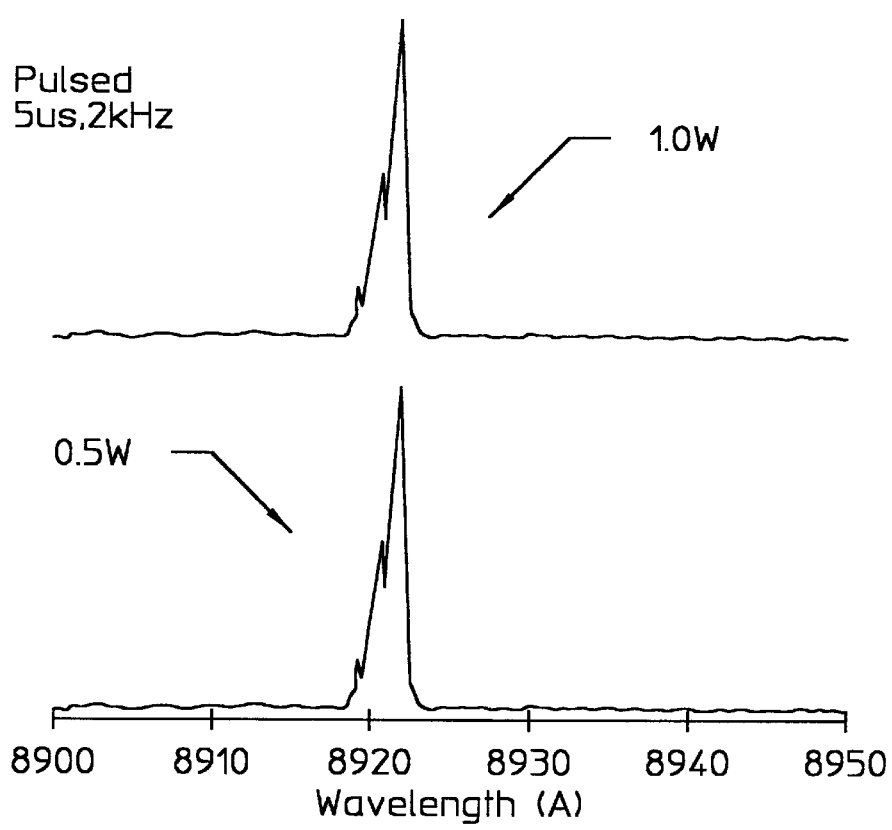
FIG. 5 are plots of emission wavelengths for pulsed operation (quasi-CW) of the exemplary device of FIG. 2.

As illustrated in FIG. 4, the spectrum of the broad-area DFB laser of the invention appears to be single frequency near threshold with a temperature dependence of 0.6 Å/C and maintains a narrow linewidth at 1 W output power as shown by the right-hand peak in FIG. 4. The FWHM for the CW spectrum at 0.53 W is 0.5 Å FWHM. At 1.1 W, if a width is approximated based on the envelope of the peaks, the spectrum broadens to about 0.9 Å FWHM. Under quasi-CW conditions, as illustrated in FIG. 5, the spectrum is broader than the CW spectrum, which can be attributed to thermal-induced and carrier-induced transients (chirp). The spectra measured for 5 $\mu$s pulses at a frequency of 2 kHz yields widths of 0.9 Å and 1.2 Å FWHM at 0.5 W and 1.0 W, respectively, as shown by the lower and upper spectra diagrams in FIG. 5. In contrast, the spectra near threshold of Fabry-Perot lasers have a width of over 10 Å FWHM and reach 20 Å FWHM at 1 W CW. The angular FWHM of a lateral farfields for the broad area DFB lasers of the invention is approximately 4° near threshold, 5° at 0.5 W, and 6.5° at 1.0 W under both CW and pulse conditions, indicating that some spatial mode discrimination occurs as compared to the Fabry-Perot devices which have 8° FWHM farfields at low drive levels.

Figure 6:
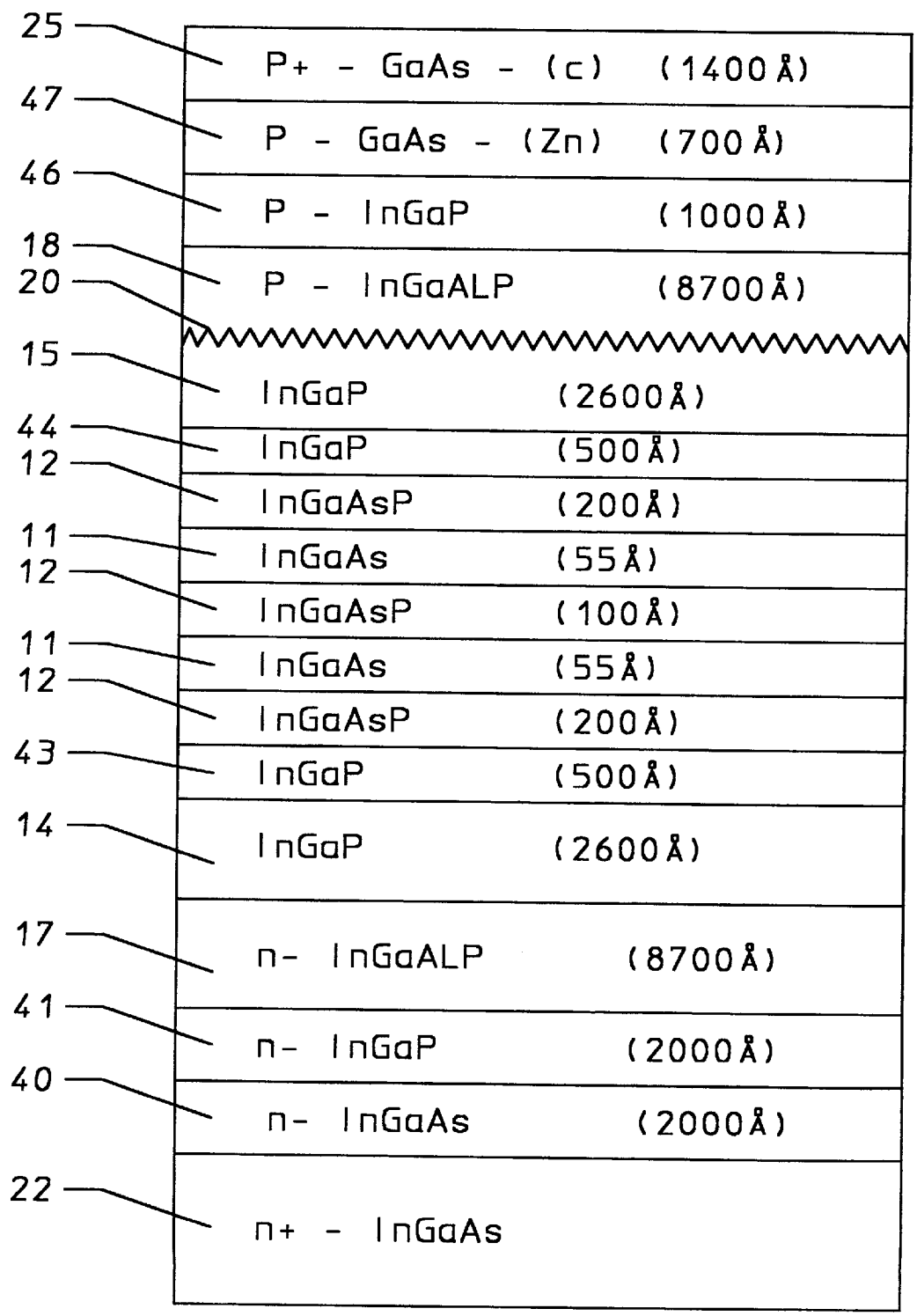
FIG. 6 is a simplified view of the detailed multi-layer structure of an exemplary device in accordance with the invention.

An exemplary detailed fabrication process for the large aperture DFB lasers of the invention is given below, and forms the epitaxial layer structure on a GaAs substrate as illustrated in FIG. 6.

The grating base structure is grown in a low-pressure (50 mbar) metal organic chemical vapor deposition (MOCVD) reactor at 700° C. The substrate 22 is an epi-ready n+ GaAs substrate on orientation, (100). As illustrated in FIG. 6, the following epitaxial layers (with exemplary thicknesses shown) are grown in sequence on the substrate (including suitable buffer and transitional layers in addition to the main functional layers shown in FIG. 2): n-GaAs buffer layer 40; n-InGaP transition layer 41 (lattice matched); n-In$_{0.5}$(Ga$_{0.5}$Al$_{0.5}$)$_{0.5}$P lower cladding layer 17 (lattice matched) InGaP optical confinement layer 14 (lattice matched); InGaP slow growth rate layer 43 (lattice matched); InGaAsP transition barrier layer 12 (lattice matched–Eg=1.62 eV); InGaAs quantum well 11; InGaAsP barrier layer 12 (lattice matched–Eg=1.62 eV); InGaAs quantum well 11; InGaAsP transition barrier layer 12 (lattice matched–Eg=1.62 eV); InGaP slow growth rate layer 44 (lattice matched); InGaP optical confinement layer 15 (lattice matched). All n-type layers are Si doped.

The gratings are holographically defined in photoresist and then transferred into the exposed InGaP confinement layer 15 using wet chemical etching. The surface of the layer 15 is cleaned in a HF:DI water (1:10) solution for 30 seconds. It is then rinsed in a DI (deionized) water solution for 5 minutes and blown dry with nitrogen gas. A solution of Shipley 1805 photoresist:Shipley Type P thinner (1:2) is spin coated onto the sample at 5000 rpm for 30 seconds. The coated sample is then baked in an oven at 90° C, for 30 minutes.

The photoresist is exposed by light from an Ar-Ion laser. The light travels through a 50%/50% beam splitter. Each leg of the split beam goes through a spatial filter to generate diverging coherent spherical waves. The light from each of the two beams is then reflected onto the sample. The sample is aligned such that the periodic lines produced by the laser are parallel to the crystal plane that forms the cleaved facet of the laser. The laser is set to 200 mW, with the power density of each leg measured at roughly 30 mW/sq. cm at the sample. The sample is exposed under these condition for a time of 60 sec.

The exposed photoresist is then spray developed using Shipley ME-321 developer on a spinner rotating at 2000 rpm for a time of 10 sec. The sample is then spray rinsed with DI water at 2000 rpm for 1 minute, and allowed to spin dry at 2000 rpm for 1 minute. The InGaP is etched in a solution of [Br$_2$:HBr (1:17)]:DI (1:80) for 20 seconds and rinsed in DI water for 10 minutes. The sample is then blown dry with nitrogen gas. The sample is stripped in Shipley 1165 photoresist stripper for 5 min and rinsed in DI water for 10 minutes. The surface is then cleaned in acetone for 1 minute and methanol for 1 minute. This is followed by rinsing in DI water for 3 minutes and blowing the sample dry with nitrogen gas. The surface is treated with a mild oxygen plasma etch in a Plasmatherm etcher. 25 sccm of O$_2$ gas flows into the reactor maintained at a pressure of 20 mT. A 100W plasma is excited for 4 minutes. The sample is etched in a buffered oxide etch (BOE)—NF$_3$:HF (20:1) for 30 seconds, and rinsed in DI water for 5 minutes. The sample is then blown dry with nitrogen gas.

The upper cladding layer and a highly doped cap are then grown over the grating using the same MOCVD system. The In compounds are grown at 700° C. and are Zn-doped. The first GaAs layer is grown at 625° C. and is Zn-doped. The last layer is grown at 575 C and is C-doped. The following layers are grown in sequence: p-In$_{0.5}$(Al$_{0.5}$Ga$_{0.5}$)$_{0.5}$P upper cladding layer 18 (lattice matched); p-InGaP transition layer 46 (lattice matched); p-GaAs layer 47; p+-GaAs highly doped cap 25 (p~10$^{20}$ cm$^{-3}$).

The following process is used to produce a broad-stripe current confined laser using oxide isolation. Of course, current confinement may be provided in a conventional manner via back-biased p-n junctions, proton implantation, etc., and lateral index guiding may also be utilized if desired. Shipley 1805 photoresist is spin coated onto the sample at 5000 rpm for 30 seconds. The coated sample is baked in an oven at 90° C. for 30 min. The photoresist is exposed in a Karl-Suss mask aligner with a first mask. The sample is aligned such that the stripes of the mask are perpendicular to the crystal plane that forms the cleaved facet of the laser. The exposed photoresist is developed in Shipley MF-321 with mild agitation for 1 minute. The sample is then rinsed with DI water for 3 minutes, and blown dry with nitrogen gas. The developed sample is baked in an oven at 110° C. for 30 min. The GaAs cap 25 is etched in a NH$_4$OH:H$_2$O$_2$:DI water (3:1:50) solution for 1 minute. It is then rinsed in a DI water solution for 5 minutes and blown dry with nitrogen gas. The sample is then stripped in Shipley 1165 photoresist stripper for 5 min. and rinsed in DI water for 10 minutes. The surface is cleaned in acetone for 1 minute and methanol for 1 minute. This is followed by rinsing in DI water for 3 minutes and blowing the sample dry with nitrogen gas. The surface is then coated with an 80 nm SiO$_2$film deposited in a Plasmatherm plasma enhanced chemical vapor deposition (PECVD) reactor. The chamber is heated to 60° C. and the substrate to 250° C. N$_2$O and SiH$_4$ (2% in N$_2$) are flowed at rates of 810 sccm and 440 sccm, respectively, into the reactor maintained at a pressure of 900 mT. A 30 W plasma is excited for 100 seconds.

Shipley 1805 photoresist is then spin coated onto the sample at 5000 rpm for 30 seconds. The coated sample is baked in an oven at 90 C for 30 minutes. The photoresist is exposed in a Karl-Suss mask aligner with a second mask. The sample is aligned such that the contact stripe is centered between the isolation grooves. The exposed photoresist is developed in Shipley MF-321 with mild agitation for 1 minute. The sample is then rinsed with DI water for 3 minutes, and blown dry with nitrogen gas. The developed sample is baked in an oven at 110 C for 30 min.

The SiO$_2$ layer 26 is etched in a buffered oxide etch (BOE)—NF$_3$:HF (20:1) for 1 minute, and rinsed in DI water for 5 minutes. The sample is then blown dry with nitrogen gas. The sample is stripped in Shipley 1165 photoresist stripper for 5 min and rinsed in DI water for 10 minutes. The surface is cleaned in acetone for 1 minute and methanol for 1 minute. This is followed by rinsing in DI water for 3 minutes and blowing the sample dry with nitrogen gas. The p-side metal contact electrode 27 is deposited using an electron beam evaporator. A three metal contact is used consisting of Ti(20 nm), Pt(50 nm), and Au(300 nm). The sample is wax mounted p-side down to a glass plate and thinned to 100 µm by mechanical lapping with 9 µm slurry. The sample is then released and rinsed with acetone to remove the remaining wax. The surface is cleaned in acetone for 1 minute and methanol for 1 minute. This is followed by rinsing in DI water for 3 minutes and blowing the sample dry with nitrogen gas. The n-side metal contact 29 is deposited on the back side of the sample using an electron beam evaporator. A four metal contact is used consisting of Ge(10 nm), AuGe alloy(100 nm), Ni(30 nm), and Au(200 nm). The sample is heated in forming gas (10.5% H$_2$ in N$_2$) in a rapid thermal annealer (RTA). The heat cycle is 375 C for 30 seconds. The sample is then scribed at the edge and cleaved in bars. The cleaved edge faces 31 and 32 are perpendicular to the laser stripes, and form the reflecting facets of the laser cavity. The front and back edge facets 31 and 32, respectively, of the lasers are coated with an anti-reflective (AR) and highly-reflective (HR) dielectric layers, respectively. A typical AR coating consists of a quarter-wave thick layer of Al$_2$O$_3$. The HR coating may consist of, for example, multiple pairs of quarter-wave SiO$_2$ and Si layers. These layers can be deposited in an electron beam evaporator. The bars may then be cut into individual devices by scribing lines between the stripes and breaking the bar into devices, o dicing the chips with a diamond saw.

Figure 7:
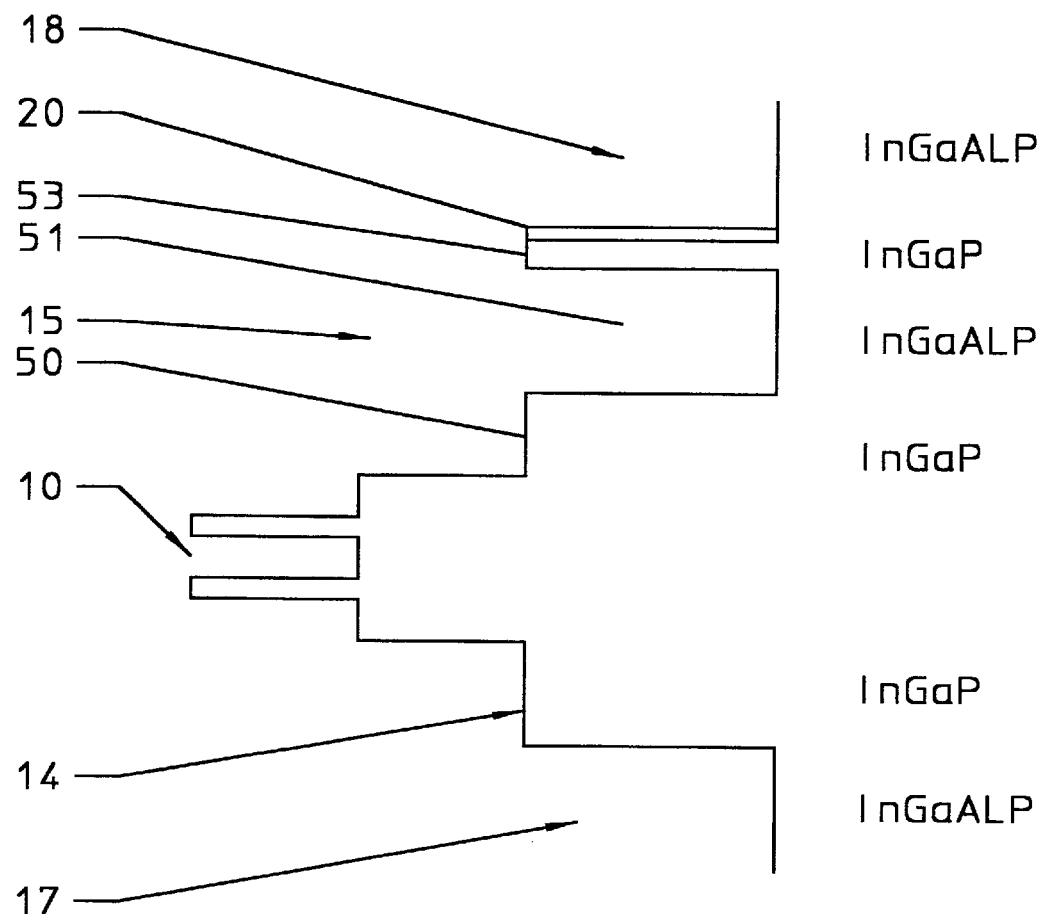
FIG. 7 is an illustrative diagram of an alternative exemplary composition for a semiconductor laser in accordance with the invention.

It is understood that the particular multi-layer structure described above is not the only structure in which the present invention may be embodied and that the invention is not limited to that structure. An example of a modified embodiment is illustrated in FIG. 7 in which a first section 50 of an optical confinement layer 15 of InGaP is formed above the active region layer 10, followed by an intermediate optical confinement layer section 51 of InGaAlP. A further section of the upper confinement layer 15, formed of aluminum free InGaP 53, is then formed over the layer 51, and the grating 20 is then formed as discussed above on the surface of the aluminum free layer 53. Many other variations on this structure are possible. For example, the upper and lower confinement layers adjacent to the active region layer may be formed of InGaAlP, with the aluminum free section of the upper confinement layer then being formed over the upper layer of InGaAlP. Further, the upper cladding layer can be AlGaAs instead of InGaAlP. It is also understood that other optical confinement layer materials may be utilized, such as InGaAsP for wavelengths greater than about 0.8 µm and GaAs for wavelengths greater than about 0.92 µm. For structures in which the aluminum free InGaP section of the upper confinement layer is formed over a layer of InGaAlP, it is preferred that the layer of InGaAlP is relatively thick, e.g., greater than about 0.2 µm, so that a small part of the optical mode will "see" the grating. This has the advantage of small coupling to the grating, allowing for high output powers, and any damage at the grating interface does not affect the device performance.

Figure 8:
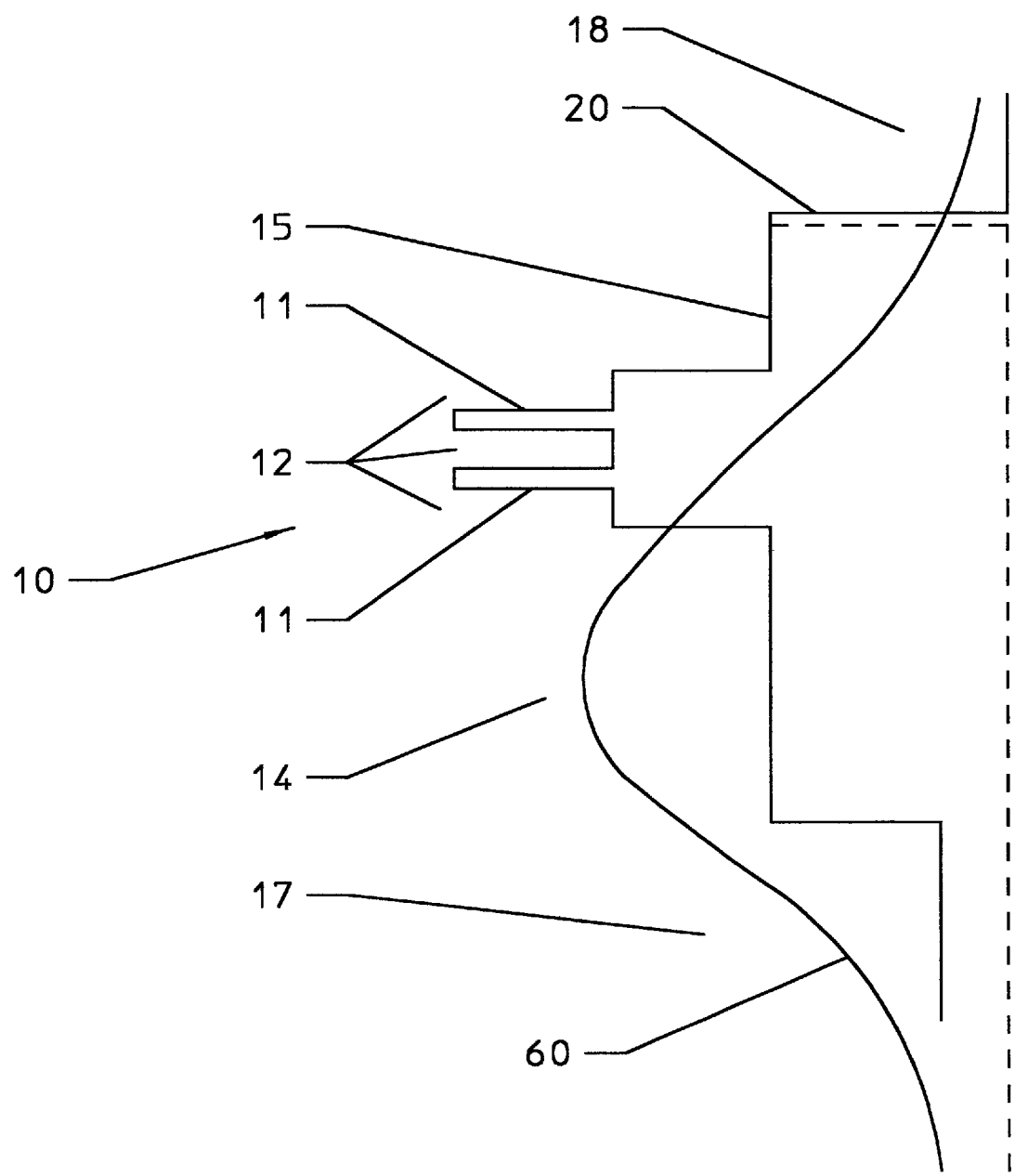
FIG. 8 is an illustrative diagram of an alternative composition for a semiconductor laser which has an asymmetric transverse optical waveguide.

Another example of a modified structure is illustrated in FIG. 8 in which the optical confinement layers 14 and 15 and the cladding layers 17 and 18 are formed to provide an asymmetric transverse optical waveguide supporting only the fundamental transverse mode. The lower cladding layer 17 has an index of refraction higher than that of the upper cladding layer 18, which causes the optical mode to have both low overlap with the grating layer 20 as well as low overlap with the active region 10. The field intensity profile is illustrated by the line labeled 60 in FIG. 8. Thus, this structure simultaneously provides the desired small coupling to the grating and a small transverse optical confinement factor, Γ, which ensures a large equivalent transverse spot size for high power operation.

Other material systems may be used for the quantum wells of the active region layer. One further example of a material system for the quantum wells is In$_{1-x}$Ga$_x$As$_y$P$_{1-y}$, where 0<x<1 and 0<y<1.

It is understood that the invention is not confined to the particular embodiments set forth herein as illustrative, but embraces all such modified forms thereof as come within the scope of the following claims.

What is claimed is:

1. An edge emitting semiconductor laser comprising:
    (a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate;
    (b) means for confining the current from the electrodes to a stripe region wherein the stripe width is at least 25 µm wide; and
    (c) a distributed feedback grating formed on an aluminum free section of the upper confinement layer comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser.

2. The semiconductor laser of claim 1 wherein the upper confinement layer is formed of InGaP.

3. The semiconductor laser of claim 1, wherein the electrodes are formed on upper and lower faces of the semiconductor laser and with the upper electrode formed on a cap layer to define an active stripe width in the active region layer at which light emission occurs.

4. An edge emitting semiconductor laser comprising:
    (a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate, wherein the electrodes are formed on upper and lower faces of the semiconductor laser and with the upper electrode formed on a cap layer to define an active stripe width in the active region layer at which light emission occurs, wherein the stripe width is about 100 µm; and
    (b) a distributed feedback grating formed on an aluminum free section of the upper confinement layer comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser.

5. The semiconductor laser of claim 1 wherein the upper and lower confinement layers are formed of InGaP, the active region layer is formed of InGaAsP barrier layers and at least one InGaAs quantum well layer between the InGaAsP barrier layers, the lower and upper cladding layers are formed of n-type InGaAlP and p-type InGaAlP respectively, and the substrate is formed of GaAs.

6. An edge emitting semiconductor laser comprising:
(a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate, wherein the upper and lower confinement layers are formed of InGaP, the active region layer is formed of InGaAsP barrier layers and at least one InGaAs quantum well layer between the InGaAsP barrier layers, the lower and upper cladding layers are formed of n-type InGaAlP and p-type InGaAlP respectively, and the substrate is formed of GaAs, wherein the active region layer has multiple quantum wells defined by layers of InGaAs separated by InGaAsP barrier layers; and
(b) a distributed feedback grating formed on an aluminum free section of the upper confinement laver comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser.

7. The semiconductor laser of claim 6 wherein the epitaxial structure is grown on orientation on a (100) surface of the GaAs substrate.

8. An edge emitting semiconductor laser comprising:
(a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate, wherein the active region layer includes at least one quantum well formed of $In_{1-x}Ga_xAs_yP_{1-y}$ where $0<x<1$ and $0<y<1$; and
(b) a distributed feedback grating formed on an aluminum free section of the upper confinement layer comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser.

9. The semiconductor laser of claim 1 wherein the grating is formed on an upper confinement layer of InGaP and the upper cladding layer is formed of AlGaAs.

10. The semiconductor laser of claim 1 wherein the period of the elements in the distributed feedback grating is selected to provide a second order grating with respect to the selected effective wavelength of the light emitted from the active region.

11. An edge emitting semiconductor laser comprising:
(a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate; and
(b) a distributed feedback grating formed on an aluminum free section of the upper confinement layer comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser, wherein the active region layer is formed of upper and lower barrier layers of InGaAsP and multiple quantum well layers of InGaAs separated by barrier layers of InGaAsP and wherein the upper confinement layer includes a layer of InGaAlP adjacent to the active region layer and a layer of InGaP over the layer of InGaAlP, the distributed feedback grating formed in the upper surface of the InGaP layer.

12. An edge emitting semiconductor laser comprising:
(a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate; and
(b) a distributed feedback grating formed on an aluminum free section of upper confinement layer comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser, wherein the grating is formed to select light at a wavelength of 0.894 µm.

13. An edge emitting semiconductor laser comprising:
(a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate, wherein the optical confinement layers or the cladding layers, or both, are formed to provide an asymmetric transverse optical waveguide supporting only the fundamental transverse mode; and (b) a distributed feedback grating formed on an aluminum free section of the upper confinement layer comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser.

14. The semiconductor laser of claim 1 wherein one edge face has a fully reflective coating thereon and the other edge face has an antireflective coating thereon.

15. An edge emitting semiconductor laser comprising:
(a) a semiconductor substrate, an epitaxial structure on the substrate including a layer with an active region at which light emission occurs, upper and lower confinement layers adjacent the active region layer, upper and lower cladding layers adjacent the confinement layers, edge faces perpendicular to the active region layer, and electrodes by which voltage can be applied across the epitaxial structure and the substrate; and
(b) a distributed feedback grating formed on an aluminum free section of the upper confinement layer comprising periodically alternating elements, the adjacent elements in the grating differing from one another in dielectric constant to provide optical feedback for a selected effective wavelength of light generation from the active region, the grating formed and positioned to act upon the light generated in the active region to produce lasing action and emission of light from an edge face of the semiconductor laser, wherein the product of the grating coupling coefficient κ and the cavity length L between the edge faces is about 1.

16. A semiconductor laser comprising:
a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, and including means for confining the current from the electrodes to a stripe region, wherein the stripe width is at least 25 μm wide.

17. The semiconductor laser of claim 16 wherein the current from the electrodes is confined to a stripe region and wherein the electrodes are formed on upper and lower faces of the semiconductor laser and with the upper electrode formed on a cap layer to define the active stripe width in the active region layer at which light emission occurs.

18. A semiconductor laser comprising:
a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, wherein the current from the electrodes is confined to a stripe region and wherein the electrodes are formed on upper and lower faces of the semiconductor laser and with the upper electrode formed on a cap layer to define the active stripe width in the active region laver at which light emission occurs, and wherein the stripe width is about 100 μm.

19. The semiconductor laser of claim 18 wherein the lower and upper cladding layers are formed of n-type InGaAlP and p-type InGaAlP, respectively.

20. A semiconductor laser comprising:
a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, wherein the active region layer has multiple quantum wells defined by layers of InGaAs separated by InGaAsP barrier layers.

21. The semiconductor laser of claim 16 wherein the period of the elements in the distributed feedback grating is selected to provide a second order grating with respect to the selected effective wavelength of the light emitted from the active region.

22. A semiconductor laser comprising:
a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, wherein the active region layer is formed of upper and lower barrier layers of InGaAsP and multiple quantum well layers of InGaAs separated by barrier layers of InGaAsP and wherein the upper confinement layer includes a layer of InGaAlP adjacent to the active region layer and a layer of InGaP over the layer of InGaAlP, the distributed feedback grating formed in the upper surface of the InGaP layer.

23. A semiconductor laser comprising:

a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, wherein the grating is formed to select light at a wavelength of 0.894 $\mu$m.

24. The semiconductor laser of claim 16 wherein one edge face has a fully reflective coating thereon and the other edge face has an anti-reflective coating thereon.

25. The semiconductor laser of claim 16 wherein the epitaxial structure is grown on orientation on a (100) surface of the GaAs substrate.

26. A semiconductor laser comprising:

a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, wherein the spacing between the grating and the active region layer is at least 0.2 $\mu$m.

27. A semiconductor laser comprising:

a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, wherein the optical confinement layers or the cladding layers, or both, are formed to provide an asymmetric transverse optical waveguide supporting only the fundamental transverse mode.

28. A semiconductor laser comprising:

a GaAs substrate, an epitaxial structure on the substrate including a lower cladding layer of InGaAlP or AlGaAs, a lower optical confinement layer of InGaP, a layer with an active region at which light emission occurs including at least one quantum well layer of InGaAs between barrier layers of InGaAsP, an upper confinement layer of InGaP, an upper cladding layer of InGaAlP or AlGaAs, edge faces perpendicular to the active region layer, and electrodes by which voltage can be applied across the substrate and epitaxial structure, and a distributed feedback grating formed on the upper aluminum free InGaP confinement layer for interacting with light generated in the active region to produce lasing action and emission of light from an edge face of the semiconductor laser, wherein the product of the grating coupling coefficient $\kappa$ and the cavity length L between the edge faces is about 1.

* * * * *